US012625061B2

(12) United States Patent
Danilov et al.

(10) Patent No.: US 12,625,061 B2
(45) Date of Patent: May 12, 2026

(54) METHOD AND INSPECTION DEVICE FOR EXAMINING THE CATHODIC PROTECTION OF A FERROMAGNETIC PIPELINE

(71) Applicant: Rosen IP AG, Stans (CH)

(72) Inventors: Andrey Danilov, Lingen (DE); Ben Bosse, Lingen (DE); Patrik Rosen, Meppen (DE)

(73) Assignee: Rosen IP AG, Stans (CH)

( * ) Notice: Subject to any disclaimer, the term of this patent is extended or adjusted under 35 U.S.C. 154(b) by 178 days.

(21) Appl. No.: 18/559,226

(22) PCT Filed: May 6, 2022

(86) PCT No.: PCT/EP2022/062342
§ 371 (c)(1),
(2) Date: Nov. 6, 2023

(87) PCT Pub. No.: WO2022/234117
PCT Pub. Date: Nov. 10, 2022

(65) Prior Publication Data
US 2024/0230515 A1    Jul. 11, 2024

(30) Foreign Application Priority Data
May 7, 2021    (BE) .................................... 2021/5375

(51) Int. Cl.
*G01R 15/08*        (2006.01)
*F16L 55/26*        (2006.01)
(Continued)

(52) U.S. Cl.
CPC .............. *G01N 17/02* (2013.01); *F16L 55/26* (2013.01); *G01R 15/08* (2013.01); *G01R 15/20* (2013.01); *F16L 58/02* (2013.01); *F16L 2101/30* (2013.01)

(58) Field of Classification Search
CPC .. C23F 13/04; C23F 2201/00; C23F 2213/32; C23F 13/22; C23F 2213/31; C23F 13/20;
(Continued)

(56) References Cited

U.S. PATENT DOCUMENTS 3,264,789 A * 8/1966 Duesenberg ......... B24D 99/005
                                                    451/540
4,061,965 A    12/1977 Nelson
(Continued)

FOREIGN PATENT DOCUMENTS

WO        2014096942 A2    6/2014
WO        2019156584 A1    8/2019

*Primary Examiner* — Vinh P Nguyen
(74) *Attorney, Agent, or Firm* — Husch Blackwell LLP

(57) ABSTRACT

A method is provided for examining the cathodic protection of a metallic and in particular ferromagnetic pipeline. An inspection device is also provided for examining the cathodic protection of a pipeline, in particular of a ferro-magnetic pipeline. The inspection device is formed to be able to pass through the pipeline and in particular be driven by the medium, and includes a magnetizing device serving to create an alternating magnetic field. A magnet unit and a measuring device are provided, and includes at least one magnetic field sensor serving to measure a magnetic field formed on the inner side of the wall of the pipeline.

25 Claims, 12 Drawing Sheets

(51) Int. Cl.
| | | |
|---|---|---|
| *G01N 17/02* | (2006.01) | |
| *G01R 15/20* | (2006.01) | |
| *F16L 58/02* | (2006.01) | |
| *F16L 101/30* | (2006.01) | |

(58) Field of Classification Search
CPC ....... C23F 13/06; F16L 2101/30; F16L 55/26; F16L 58/00; F16L 58/02; F16L 55/00; G01N 17/02; G01N 29/265; G01N 27/87; G01N 17/006; G01N 17/043; G01N 21/952; G01N 21/954; G01N 27/83; G01N 27/9046; G01R 15/08; G01R 15/20; G01R 29/12; G01R 31/12; G01R 31/3275; G01R 31/58; G01V 3/02
See application file for complete search history.

(56) References Cited

U.S. PATENT DOCUMENTS

| | | | | |
|---|---|---|---|---|
| 5,087,873 | A * | 2/1992 | Murphy | G01V 3/06 |
| | | | | 324/71.2 |
| 5,362,962 | A * | 11/1994 | Barborak | G01N 21/952 |
| | | | | 250/234 |
| 7,027,957 | B2 * | 4/2006 | Fourie | G01R 31/12 |
| | | | | 324/424 |
| 10,989,529 | B2 * | 4/2021 | Abdellatif | B63G 8/001 |
| 11,428,622 | B2 * | 8/2022 | Borin | G01N 17/02 |

* cited by examiner

METHOD AND INSPECTION DEVICE FOR EXAMINING THE CATHODIC PROTECTION OF A FERROMAGNETIC PIPELINE

CROSS REFERENCE

This application claims priority to PCT Application No. PCT/EP2022/062342, filed May 6, 2022, which itself claims priority to Belgian Patent Application No. BE2021/5375, filed May 7, 2021, the entireties of both of which are hereby incorporated by reference.

FIELD OF THE INVENTION

The present invention relates to a method for examining the cathodic protection of a metallic and in particular ferromagnetic pipeline. Further, the invention relates to an inspection device for examining the cathodic protection of a pipeline, in particular of a ferromagnetic pipeline, the inspection device being formed to be able to pass through the pipeline and in particular be driven by the medium, and comprising a magnetizing device serving to create an alternating magnetic field and having at least a magnet unit and a measuring device comprising at least one magnetic field sensor and serving to measure a magnetic field formed on the inner side of the wall of the pipeline.

BACKGROUND OF THE INVENTION

Metallic pipelines are often laid in the ground or in water. As a rule, these surroundings represent an electrolytic medium. A charge transport from the metal of the pipeline in the direction of the electrolyte arises at defects in the coating of the pipeline. The pipeline corrodes as a result of the transport of metal ions. To prevent corrosion from developing, the prior art provides for the application of a DC current to the pipelines to be protected. This protective current creates a cathodic polarization of the pipeline and prevents metal ions from being detached from the pipe surface.

The corrosion can develop very quickly at the coating defects in the pipeline walls if this so-called cathodic protection fails. Therefore, the cathodic protection is checked at relatively short intervals of one month or a few months. Moreover, such inspections help to find and remedy the coating defects in a timely manner. A hole in a pipeline formed as an oil or gas pipeline, for example, may lead to catastrophic environmental damage.

As a rule, the cathodic protection is checked at a few critical measurement points by measuring the installation-ground potential. The appropriate devices are fixedly installed at the measurement locations. Additionally, the potential field at the surface can be measured along the pipeline and in the pipeline surroundings. For offshore pipelines, potential measurements are performed with the aid of remote-controlled underwater vehicles. As a rule, the potential measurement is very expensive and connected with a great manual outlay.

A further method for checking the cathodic protection is based on the measurement of the DC current directly in the pipeline wall using an inspection device that is able to pass through the pipeline, which is to say movable within the pipeline, and also referred to as a pig. This approach enables measurements along the entire pipeline and represents a cost-effective, reliable method for estimating the efficiency of the cathodic protection and for detecting coating defects. However, the measurement requires a robust method which can also be used under difficult measurement conditions in a pipeline in the form of an oil pipeline for example.

A method known from the prior art for measuring the current intensity using a pig is based on the measurement of potential values in the pipeline wall in front of and behind an inspection device moved through the pipeline in the longitudinal direction of the latter. The currents in the pipeline wall and the potential distribution along the pipeline can be determined from the measured potential difference. However, this approach requires a good galvanic contact with the wall for a reliable measurement. Thus, the pipeline must be cleaned well for the measurement. As a rule, such a measurement is not possible in the case of pipelines with internal coating and/or an oil medium transported in the pipeline.

BRIEF SUMMARY OF THE INVENTION

It is the object of the present invention to develop a cost-effective and reliable method and an associated inspection device for examining the cathodic protection of a pipeline.

In the method according to the invention for examining the cathodic protection of a pipeline, in particular a ferromagnetic pipeline, a primary alternating magnetic field and, accompanying this, a local change in the permeability in the wall of the pipeline is created by means of a magnetizing device of an inspection device moved through the pipeline. At the same time, a secondary DC magnetic field caused by a DC current of the cathodic protection is formed in the wall of the pipeline. Further, a resultant magnetic field which emerges from the superposition of the primary alternating field and the secondary DC magnetic field is measured by means of a measuring device which is moved through the pipeline and comprises at least one magnetic field sensor, said measuring device likewise being part of the inspection device in particular. Further, a computing device is used to analyze the signal components of at least the secondary DC magnetic field giving consideration to the change in the permeability. The magnitude of the DC current is derived on the basis of the signal components of the secondary magnetic field. The signal components are typically analyzed after the data has been read from the inspection device, once the latter has completed the inspection run, and after said data has been loaded onto the computing device. Both field-used laptops, desktop PCs and servers, on which an associated evaluation software runs in each case, come into question as computing devices. The evaluation software in particular has access to the respective memory and non-volatile storage, the respective processors, and interfaces for data transfer between the necessary computing means. Likewise, databases may be linked locally or in cloud-based fashion and these store data, in particular calibration data, required for the evaluation.

The invention is based on the insight that the application of a relatively strong magnetic field to the pipeline wall changes the magnetic permeability in this region of the pipeline wall and that subsequently, on account of the inhomogeneous distribution of the magnetic permeability, the magnetic leakage flux of the DC current, which otherwise is not measurable on the inside of the pipeline wall, can penetrate into the interior of the pipeline and can be measured from the inner side of the pipeline, which is to say by measuring equipment moved within the pipeline.

For the description of the present invention, the secondary DC magnetic field is also referred to as secondary magnetic field for reasons of simplicity.

The resultant magnetic field in the pipeline is a sum of the magnetic field induced by the external strong magnetic field and the magnetic field induced by the DC current in the pipeline wall. The magnetizing device is formed dependent on the wall thickness and the material such that the greatest possible change in the permeability is achieved so that an evaluable signal is created by superimposing the primary alternating field on a secondary magnetic field which was created by the DC current and which reaches into the pipeline interior with a (leakage) flux component on account of the local change in permeability and the inhomogeneous distribution of the magnetic permeability accompanying this, and the magnitude of the DC current is implemented on the basis of the signal components of the secondary magnetic field. In this way, the DC current can be measured indirectly and determined over the entire length of a pipeline in a simple manner and without the previous limitations resulting from for example oil-contaminated, internal surfaces of the pipeline wall.

In particular, the magnitude of the DC current is derived by comparing the determined signal components with the data in a calibration database, which comprises the leakage flux components of the secondary magnetic field arising close to the wall on the inner side of a pipeline for a multiplicity of magnetic field strengths, materials, pipeline wall thicknesses, and/or DC current magnitudes.

The strength of the alternating magnetic field created locally by a magnetizing device is greater than the strength of the DC magnetic field in particular at least by a factor of 50, preferably at least by a factor of 100, and more preferably by a factor of 500. Consequently, a strong primary magnetic field is induced in order to obtain a sufficient change in the magnetic permeability. The induced secondary magnetic field is very small in comparison with the primary magnetic field. On account of the insight that the magnetic permeability depends only on the amplitude of the applied magnetic field, however, the magnetic permeability varies twice as fast as the primary magnetic field. The secondary magnetic field changes at the same rate as the magnetic permeability, which is to say it varies twice as fast as the primary magnetic field; this is used to identify the signal components of the secondary magnetic field.

The frequencies of the introduced alternating magnetic field are preferably less than 500 Hz, and greater than 5 Hz in particular. The effects can be observed particularly well below 500 Hz.

In particular, the magnetic field arising from the primary and secondary magnetic fields is measured during the creation of the alternating field, with the result that the time profile of the measured signal can be recorded and evaluated during the creation of the alternating field.

The spectrum of the secondary magnetic field is preferably determined in the computing device, with this possibly initially referring to the analysis of the entire signal, from which the signal components of the secondary field are subsequently derived. Now, the spectral analysis known per se, for example in the form of a Fourier analysis, is used to determine an external DC magnetic field, which otherwise is actually not measurable to the inside of the pipeline wall.

Preferably, at least one signal component which is an even multiple of the frequency of the directional change of the magnetic field is selected in the analysis for determining the DC current. In particular, the scope of the spectral analysis considers all signal components corresponding to an even multiple of the frequency of the directional change of the alternating field, with the zero frequency not being considered. The frequency of the strength of the secondary magnetic field $H_s(t)$ is twice as large as the frequency of the strength of the primary magnetic field $H_p(t)$. This difference in the variation allows the signals $H_p(t)$ and $H_s(t)$ to be separated in the frequency domain. The current intensity of the cathodic protection is derived in turn from the signal of the secondary field.

For the purpose of an accurate evaluation, signal lengths of 5 to 15 main periods of the applied alternating field are considered in particular.

In particular, the current intensity is determined by means of one or more regression functions in the computing device on the basis of the amplitude of at least one even multiple of the frequency of the directional change of the magnetic field. The one or more regression functions are determined in particular on the basis of the boundary conditions present, in particular on the basis of the wall strength of the pipeline, the material of same, the applied magnetic field, the speed of the measuring device, and/or the setup of the associated magnetic field creation device. Preferably, the analysis data from the secondary magnetic field are normalized and/or calibrated here by means of the analysis data from the primary magnetic field.

For example, to calculate the current intensity/of the cathodic protection, it is possible to determine a regression function of the feature vector V=

$$\left[\frac{F(2f_m)}{F(f_m)}, \frac{F(4f_m)}{F(f_m)}, \frac{F(6f_m)}{F(f_m)}, \frac{F(8f_m)}{F(f_m)}\right],$$

where $F( )$ are the amplitudes of the respective spectrum. The individual values from the spectrum are normalized to the dominant frequency value from the signal spectrum. This normalization reduces the dependence on the variation in the magnetization strength and $I=R(V)$, where R represents the regression function.

To define the regression function, it is possible in particular to use a fit function or conventional machine learning methods such as linear regression, neural networks, decision trees, support vector machines, etc. Data can be obtained within the scope of a calibration in order to define the regression function. Depending on the equipment design, it may be necessary to define different regression functions for different measurement conditions such as wall thickness wt, magnetic properties of the pipeline material and speed v of the measuring device.

$$I = \begin{cases} R_1(V) \text{ if } wt = wt_1, v = v_1, \dots \\ R_2(V) \text{ if } wt = wt_2, v = v_2, \dots \\ \qquad \dots \end{cases}$$

These dependencies may also be introduced into the regression function as additional parameters, which is to say $I=R(V, wt, v, \dots)$. Accordingly, the current I can be defined as follows:

$$I = \begin{cases} R_1(V, wt, v) \text{ for steel } st37 \\ R_2(V, wt, v) \text{ for steel } st52 \\ \qquad \dots \end{cases}$$

A calibration can likewise be implemented via the change in the amplitudes of the odd frequencies and/or by means of the B-H curves for the odd frequencies.

The measurement conditions can be defined by the progress of the primary magnetization. Direct use of the measured signal may be sufficient to the end, with the part of the secondary magnetization being neglected. It is likewise possible to filter the frequencies $2f_m$, $4f_m$, $6f_m$, $8f_m$, . . . from the signal in order to exclude the influence of the secondary magnetic field. In particular, the measurement conditions are determined in the computing device on the basis of a spectrum of the primary alternating field in accordance with a further advantageous development, with the result that separate, additional work or measuring processes for determining the measurement conditions may be dispensed with.

Nevertheless, some of the measurement conditions may be known or else determined in advance by other measurement methods, possibly in redundant fashion.

Preferably, the voltage of the cathodic protection is varied and at least increased for one or during one measurement run of the inspection device in a development of the method according to the invention. The current intensity in the pipeline wall becomes larger and the secondary magnetic field grows as a consequence of the increase. In particular, the voltage profile may have a signal pattern for better identification of the corresponding DC magnetic field component.

A further option for improving the separation of the signals from the primary and the secondary magnetic field consists of configuring the equipment such that the spectrum of the primary magnetic field is predominantly represented by the dominant frequency component in the Fourier spectrum. As a result, it becomes easier to separate the signals from primary and secondary magnetic fields in the Fourier spectrum.

In particular, a multiplicity of data from one measurement run are fused for the determination of the current intensity. If the coating of a pipeline is undamaged, the current intensity changes very slowly and can only change suddenly at coating defects and installations. This enables a more accurate estimate of the current intensity by data fusion of the data from one run, for example by means of a Kalman filter.

Preferably, the collected measurement data from a plurality of runs can be fused in order to further improve the accuracy of the evaluation.

According to a development of the invention, the measurement of the arising magnetic field is implemented by means of at least one magnetic field sensor which is positioned at least substantially at a fixed distance from the wall, in particular with the distance of at least one magnet unit of the magnetizing device from the inner side of the wall varying. "Positioned at least substantially at a fixed distance from the wall at the measurement time" means that the sensor can be kept structurally at a fixed distance from the wall at the measurement time, but slight variations may arise on account of the movement through the pipeline of the inspection device comprising the magnetic field sensor, for example due to a bumpy run on account of contamination of the inner surface of the pipeline wall or on account of sensor lift-off as a result of weld seams. By way of example, in the case of a carrier that is moving and rolling along the wall, such a sensor may be formed by a coil winding along the rolling perimeter.

As an alternative or in addition, a ring of sensors may be arranged along the perimeter, with the sensor closest to the wall in each case recording a measurement signal.

The magnetizing device for creating the primary magnetic field may comprise a magnet unit which is formed by at least one electromagnet or by at least one permanent magnet arranged so as to be rotatable in the pipeline. The use of an electromagnet allows greater flexibility when controlling the profile of the primary magnetization but requires much electrical energy.

Preferably, the at least one magnet unit revolves in the longitudinal direction of the pipeline on a carrier designed to be rollable in particular, with the result that an alternating field is created in simple fashion. In this case, the axis of rotation of the carrier is, at least on average or at all times, transverse to the pipeline longitudinal axis. By way of example, the magnetizing device is designed as a type of magnet wheel with the wheel as a carrier, with the magnetic field sensor or sensors additionally being arranged at, on or in the wheel or carrier. Additionally, a support wheel may be present in the case of a standalone variant of an inspection device embodied by means of such a magnet and sensor wheel, with the magnet wheel being at least 3 times larger than a support wheel.

In particular, the magnetization direction of the magnet acting on the wall changes along the circumference of the carrier and/or the rotary angle of the carrier, with the result that the change in permeability in the spectrum is identified as the carrier rolls.

To be able to consider possible dependencies on changes in the measurement environment, an additional current is preferably applied during a measurement run to the inner-wall side of the pipeline by two contacts which are spaced apart in the longitudinal direction of the pipeline. It is self-evident that this applies to pipelines without an insulating internal coating. The additional current can be measured and used together with the signal change for the purpose of correcting the evaluation.

For example, the total current I in a pipeline can be calculated as follows:

$$I = kP + a, \text{ where } P = \Sigma_i c_i V_i.$$

P emerges from the sum of the components $V_i$ of the feature vector V, multiplied by a weight coefficient $c_i$. The coefficients k, a, and $c_i$ can be determined during the first calibration of the equipment prior to the run. The coefficients $c_i$ will be assumed to be a constant specific to the equipment for all possible measurement surroundings; k and a may be redefined for various measurement surroundings and stored in a database.

On account of the typically only slow change in the magnitude of the DC current of the cathodic protection, a first length without additional current may be followed by a measurement over a further length with current, applied additionally by for example the inspection device. What applies then under the assumption that there has been no change in the current of the cathodic protection is that the change $\Delta I$ in the current can be represented as follows:

$$\Delta I = k\Delta P, \text{ where } \Delta P = \Sigma_i c_i \Delta V_i.$$

The coefficient k can be recalculated from the equation. The corrected k-value allows an accurate calculation of the change in the current value. The parameter a can be determined from the database with calibrated k and a values.

In particular, the calibration can be performed when the amplitude and/or shape of the measured magnetic field has changed significantly, which is to say in particular by for example at least 5% of an amplitude of the sinusoidal profile of the entire measured magnetic field, on account of changed constraints. The measurement can be continued during the calibration, with the supplied current having to be subtracted from the measured current value.

The object stated at the outset is likewise achieved by an inspection device for examining the cathodic protection of a pipeline, in particular of a ferromagnetic pipeline, the inspection device being formed to be able to pass through the pipeline and in particular be driven by the medium, and comprising a magnetizing device serving to create an alternating magnetic field and having at least a magnet unit and a measuring device comprising at least one magnetic field sensor and serving to measure a magnetic field formed on the inner side of the wall of the pipeline, wherein the magnetizing device comprises at least one carrier which is able to be rolled through the pipeline in the longitudinal direction thereof in an operational state, the said carrier being provided with a preferably at least substantially circular perimeter in a section running transversely to an axis of rotation and, along the perimeter, comprising at least one and preferably two magnet units for creating an alternating magnetic field, the magnetic field directions of which run at least partially against one another and in particular exactly against one another. Such an inspection device is designed to create the measurement data which in the method according to the invention, as described hereinabove and/or hereinbelow, are analyzed in the computing device for the purpose of determining the DC current of the cathodic protection.

While rolling along the inner side of a pipeline wall, the carrier creates a strong alternating magnetic field at the point of contact with the wall. If use is made of only exactly one magnet unit with exactly one magnetic field generator, this should be a controllable magnet unit, the magnetic field direction of which has changed during each revolution at the point when it comes close to the inner side of the pipeline again. If at least two magnetic field units are used, this may relate to permanent magnets with magnetic field directions that are at an angle and in particular directed opposite to one another. The more frequently the magnetization directions change, the higher the dominant frequency of the induced magnetic field. In particular, the magnet unit of the magnetizing device comprises four, six, or eight permanent magnets provided with opposite magnetic field directions. The dominant frequency of the primary magnetic field emerges from the circumference of the rollable carrier and the number of magnet units, together with the speed arising by the carrier rolling on the inner side of the (wall of the) pipeline.

For the purposes of the present invention, an inspection device is designed to be driven by the medium if it can obtain at least some of the energy required for a forward movement in the pipeline during the measurement run via the medium moved in the pipeline.

Given the same distance along a pipeline wall, a higher dominant frequency allows for a more accurate measurement of the DC current. For example, a wheel with four magnets with magnetic field directions changing along the perimeter thus generates a signal with 10 periods in 5 revolutions. According to what was stated above, the permeability changes twice as fast. However, changing the magnetization direction too frequently may lead to an attenuation of the magnetic field by interaction of the magnetic poles or to a stronger distortion of the magnetic field by the eddies induced in the pipe, with the result that the frequency of the primary magnetic field should be less than 500 Hz.

The magnetizing device, preferably with the rollable carrier, may be part of an inspection device that can be propelled through a pipeline via cups or disks, together with the medium. It may also comprise a plurality of such rollable carriers for the purpose of a simultaneous, parallel measurement. Alternatively, this may also be what is known as a "smart wheel", which is to say an inspection device, the entirety of which is rollable through the pipeline, as yet to be described below.

Conventional sensors for measuring a magnetic field come into question as magnetic field sensors, in particular coils which are kept at least substantially at a fixed distance from the inner side of the pipeline wall. The rollable carrier rolls on its at least substantially circular, in particular completely circular perimeter, along which the at least one magnet unit, preferably at least two magnet units, of the carrier are arranged. A perimeter is referred to as circular if it is suitable for allowing the carrier to roll continuously in the longitudinal direction of the pipeline. For example, a slightly elliptical shape of a wheel may likewise still lead to rolling.

Preferably, the magnetizing device comprises focusing elements which are produced from magnetizable material and which, in the case of permanent magnets aligned parallel to the axis of rotation of the carrier, focus the magnetic field in the direction of the pipeline in order to bring about magnetic closure with the latter. For example, the magnets are bounded at least on one side by a surround which contains magnetizable material, in particular preferably has an annular or annular segment shape in the direction of the axis of rotation, in particular is magnetizable, and also forms the perimeter in particular. At least one focusing element can be used in each case per pole of a permanent magnet.

The magnetic field directions from the at least one magnet unit are preferably formed parallel or radially with respect to the axis of rotation of the carrier in order to obtain a magnetic field that is closed as little as possible in the circumferential direction of the carrier, or in order to obtain an introduction of the magnetic flux into the pipeline that is as good as possible by means of the focusing elements as well.

Advantageously, an inspection device according to the invention is provided with at least one magnetic field sensor along the circumference of the carrier, said magnetic field sensor being arranged on or in the carrier. In respect of its fixed distance from the wall, this sensor may be arranged on the carrier, for example in a guide or holder of the carrier, with the result that a part of the measuring device is arranged in a holder formed for an arrangement close to the wall. An arrangement close to the wall is an arrangement within a range enabling the recording of the desired signals; in particular, this is an arrangement within a distance of 10 cm from the inner side of the pipeline wall.

In particular, magnetizing device and magnetic field sensor are arranged so as to be movable relative to one another, with the result that it is always the same sensor that can be used for a measurement; this is advantageous for the evaluation and tuning of the inspection device. In particular, the carrier is rotatably mounted on the holder to this end, with the result that a "smart wheel" design is also possible. To this end, the carrier may additionally be provided via the holder with a support element in the form of a roller wheel, the diameter of which is no more than 50% of the diameter of the carrier, whereby an inspection device is formed which can be stably propelled through a pipeline by the medium.

As an alternative or cumulatively, a multiplicity of magnetic field sensors which are moved with the carrier may be arranged along the circumference according to the invention, wherein the approach to the pipeline wall in particular may also be determined by way of the measurement signals from the individual sensors, and it is consequently possible to determine and store a measurement signal at the instant of closest approach to the wall.

In particular, the or a further magnetic field sensor is designed as a coil with one or more windings running in the circumferential direction. In particular, the winding or windings of the coil are designed to run over the entire perimeter, with the result that a complete coverage of a circle is present. Measurements may be performed during the entire rolling procedure of the carrier as a result of a positioning, equidistant in relation to the axis of rotation of the carrier, along the external circumference on an at least substantially circular carrier. Likewise, two coils can be arranged next to one another or above one another in relation to the axis of rotation. Likewise, a plurality of coils may successively cover different angular regions of the carrier in the circumferential direction, and thus overall form a complete or partial coverage through 360° around the axis of rotation of the carrier.

According to a further advantageous embodiment of the invention, provision is made for a plurality of magnetic field sensors which are arranged separated from one another in space, in particular, and which measure simultaneously; this enables a better separation of the primary and secondary magnetic fields as these have different distributions in space.

For an embodiment in the form of an inspection device that can be propelled without cups or disks in particular, this inspection device may have at least one propulsion element extending away from the axis of rotation in particular. Thus, in an embodiment as a "smart wheel", laterally protruding webs may act at least temporarily like a sail in the medium, by means of which propulsion is made possible. These sails or webs may be arranged on the holder or else on the rotatable carrier and may secure the inspection device against falling over completely during operation.

Preferably, an inspection device according to the invention comprises one or more weights radially spaced apart from the axis of rotation as stabilization means, and/or one or more magnets radially spaced apart from the axis of rotation in particular are provided, wherein a respective magnetic field of the magnet or magnets interacts with the pipeline wall during the operation in order to create the desired primary alternating field.

In particular, the magnets have a greater weight than regions of the inspection device radially offset from the axis of rotation. While one weight already increases the angular momentum created and hence promotes maintenance of the axis of rotation direction, one or more magnets in the circumference or along the circumference of the inspection device at least increases the adhesion between wall and device and consequently greatly promotes a slippage-free run, in addition to any increase in angular momentum. The magnetizable material in the pipeline is magnetized when the inspection device rolls and demagnetized again when the magnet is removed during the rolling, whereby eddies are created which counteract an increase in the running speed of the device and thus greatly improve the running behavior. The magnets which create the primary alternating field thus significantly promote a more stable run of the device, firstly due to the gravitational force and secondly due to the magnetic interaction.

In particular, the carrier has a sphere-like or ellipsoid-like envelope. An ellipsoid-like shape is either an exact ellipsoid or a shape slightly deviating from an ellipsoid, which is to say deviating by less than 10 cm, preferably less than 5 cm from an ellipsoid. Further, the lengths of two semi-axes, which have the same length in particular, in the ellipsoid-like envelope are preferably longer than the length of the third semi-axis located along the axis of rotation.

The circumference of the carrier provided for rolling is preferably at least also formed by at least one damping element which is produced from plastic at least in part, which is preferably ring-shaped and/or elastic, and/or by at least one rolling element which ensures a run of the inspection device designed as a "smart wheel" that is as tremor-free as possible.

Furthermore, the carrier comprising magnetic field sensors may have a changeable mean density as a result of fillable cavities in the inspection device and/or as a result of integrable weight elements for the carrier and/or as a result of an interchangeable carrier structure, with the result that the inspection device can be used in different media.

BRIEF DESCRIPTION OF THE DRAWINGS

Reference is now made more particularly to the drawings, which illustrate the best presently known mode of carrying out the invention and wherein similar reference characters indicate the same parts throughout the views.

DETAILED DESCRIPTION OF THE DRAWINGS

The features of the exemplary embodiments according to the invention, as explained hereinbelow, may also be part of the subject matter of the invention on their own or in other combinations than presented or described, but always at least in combination with the features of one of the independent claims. If advantageous, parts having the same functional effect are provided with the same reference signs.

A numerical simulation was initially performed in order to verify the method according to the invention; in the scope of said simulation, a DC current is simulated in a wall 1 of a pipeline. Arrows 2 serve to label the magnetic field strength and the direction thereof. The larger an arrow 2, the greater the magnetic field strength at the corresponding position. The magnetic field within the pipeline is zero.

Figures 1, 2:
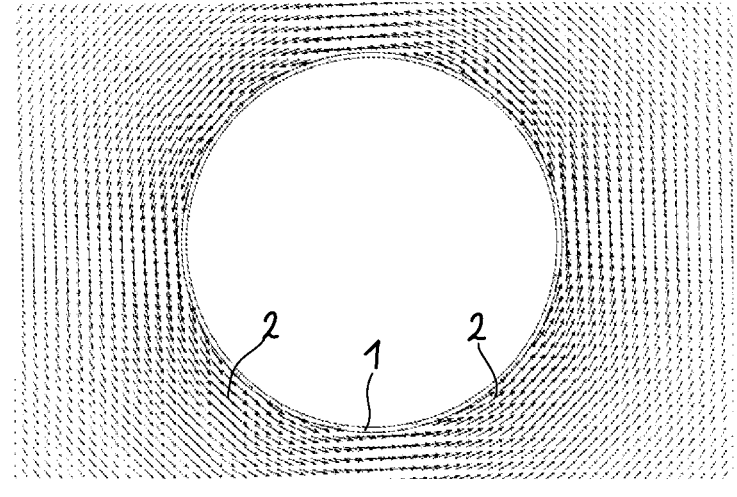
FIG. 1 shows the result of a numerical simulation of the magnetic field strength induced by DC current.
FIG. 2 shows a configuration of permanent magnets in a trial setup.
Figure 3:
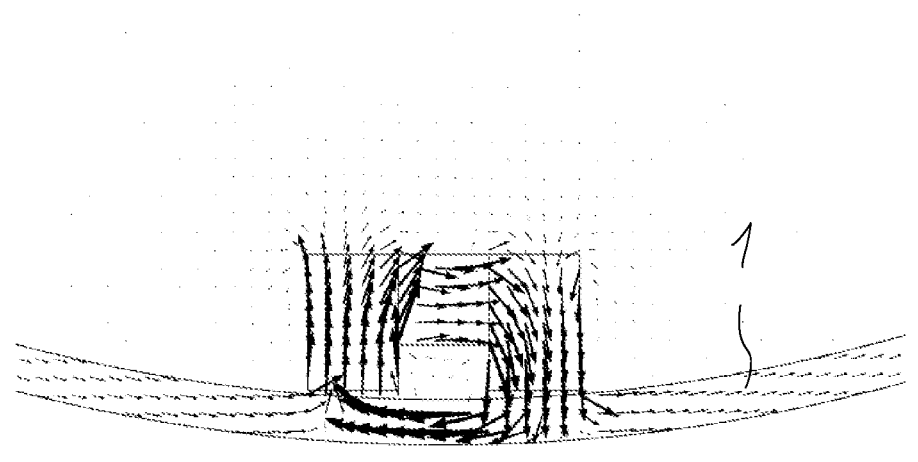
FIG. 3 shows the magnetic flux created by the setup according to FIG. 2.
Figure 4:
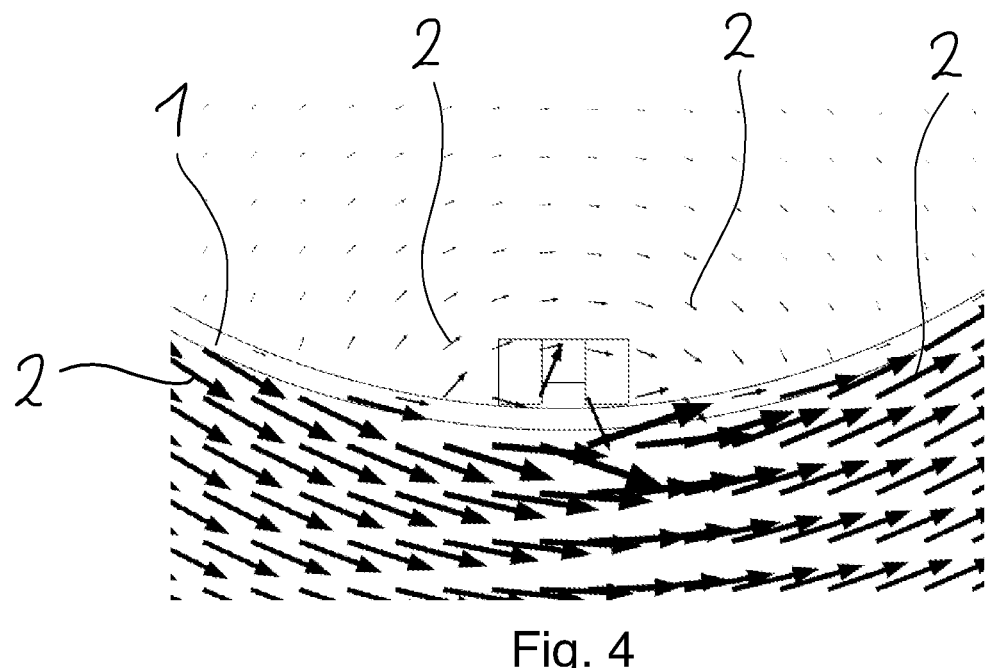
FIG. 4 shows a section of a secondary magnetic field in the case of the setup according to FIG. 2.

For further verification, the magnetic permeability of the pipeline wall 1 was now varied using a permanent magnet setup according to FIG. 2. The arrangement of three permanent magnets 3 leads to the formation of a strong magnetic flux through the wall 1 of the pipeline. On a local scale, this greatly changes the magnetic permeability in the wall 1 of the pipeline. This leads to the ingress of the secondary magnetic field created by the DC current in the wall 1 of the pipeline, illustrated by the associated arrows 2 on the inner side of the wall 1 of the pipeline.

Figure 5:
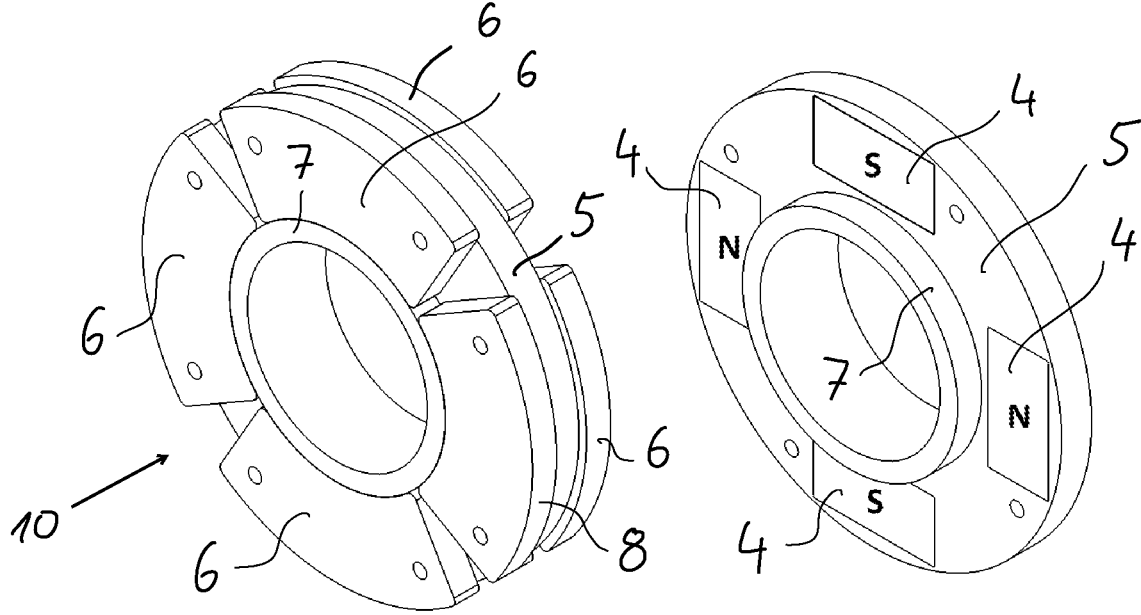
FIG. 5 shows a setup of a magnetizing device of an object according to the invention.

Now, a device according to the invention comprising a magnet unit of a magnetization device having permanent magnets 4 was used for the method according to the invention. The left-hand part of FIG. 5 depicts the permanent magnets in an associated carrier 5, which, on its circumference, can roll through the pipeline in the longitudinal direction. The magnetic field direction of permanent magnets following one another in the circumferential direction is always opposite, with the result that the sequence of north poles and south poles, identifiable in FIG. 5, arises in the circumferential direction. The carrier 5 in which the magnets 4 are arranged may be formed from a nonmagnetic material and rotates about an axis of rotation 38. For the purpose of aligning the magnetic fields of a respective permanent magnet 4, focusing elements 6 are arranged on both sides on the north and south poles of a permanent magnet and direct the magnetic field flux in the direction of the inner surface of the wall 1 of the pipeline. These focusing elements are annular segment-shaped focusing elements 6 consisting of a magnetizable material. They are fastened to the carrier 5 on one side and, on the inner side, rest on a flange 7 of the carrier. The radially outwardly directed surfaces 8 of the focusing elements 6 protrude slightly beyond the outer perimeter of the carrier 5, with the result that the outermost surface of the latter does not make a connection with the wall of the pipeline, but only rolls on the latter along the circumference of said carrier.

Figure 6:
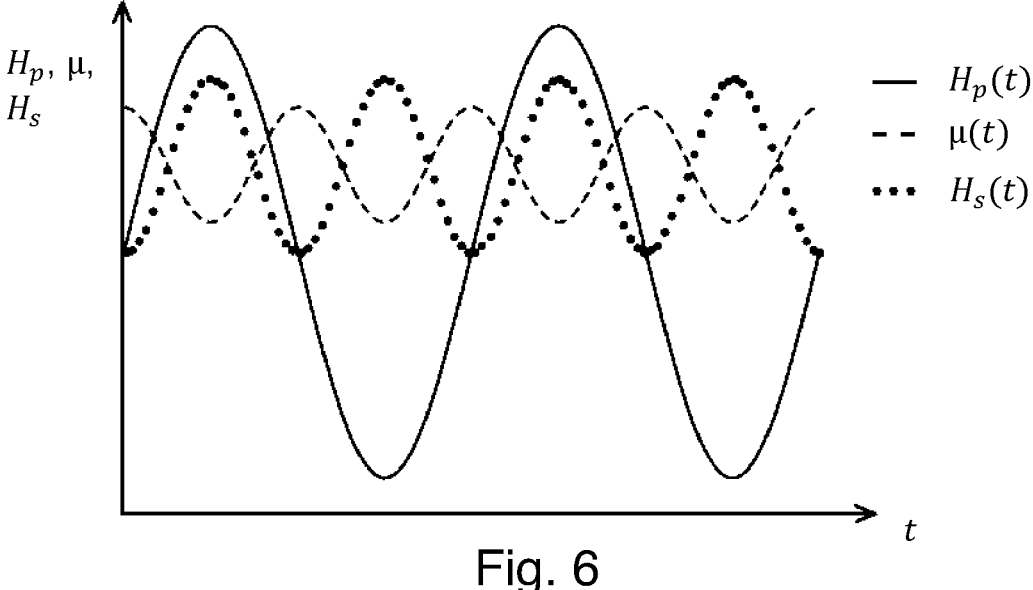
FIG. 6 shows a simplified representation of the curve of the magnetic permeability $\mu$ and of the primary and secondary magnetic field ($H_p$ and $H_s$).

When considered in the wall of the pipeline, the rolling of the magnetizing device in the form of a magnet wheel yields the profile of the primary magnetic field H$_p$(t), as depicted in FIG. 6, with the progress of the wheel. Since the permeability u depends only on the magnitude of the primary magnetic field H$_p$, the frequency of the signal is twice as high as that of the primary magnetic field. The time profile μ(t), as likewise depicted in FIG. 6, arises accordingly. Under the condition that the external constraints remain unchanged and, for example, no defects are present, the local change in the permeability then in turn yields the profile of the secondary magnetic field H$_s$ measurable on the inner side of the pipeline.

Figure 7:
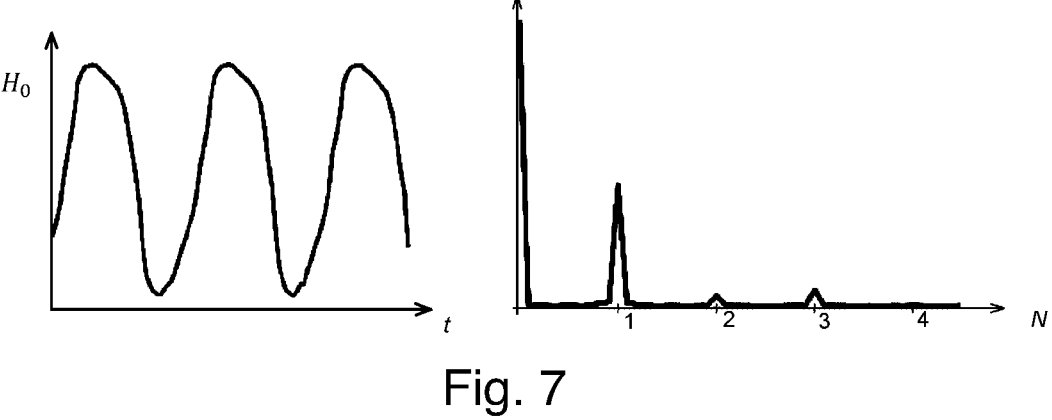
FIG. 7 shows an amplitude of the magnetic field measured on the inner side of the wall of the pipeline and a spectrum of the measured signal.

A magnetizing device according to FIG. 5 brings about the magnetic field measured on the inner surface of the pipeline wall in accordance with the left-hand part of FIG. 7, wherein no DC current of a cathodic protection was applied within the pipeline wall. A spectral analysis then exhibits the peak of the dominant frequency at N=1 in the right-hand part of FIG. 7. N is a multiple of the dominant frequency f$_m$. The smaller peaks at N=2 and N=3 arise from the measurement inaccuracies as this is not an ideal system.

Figure 8:
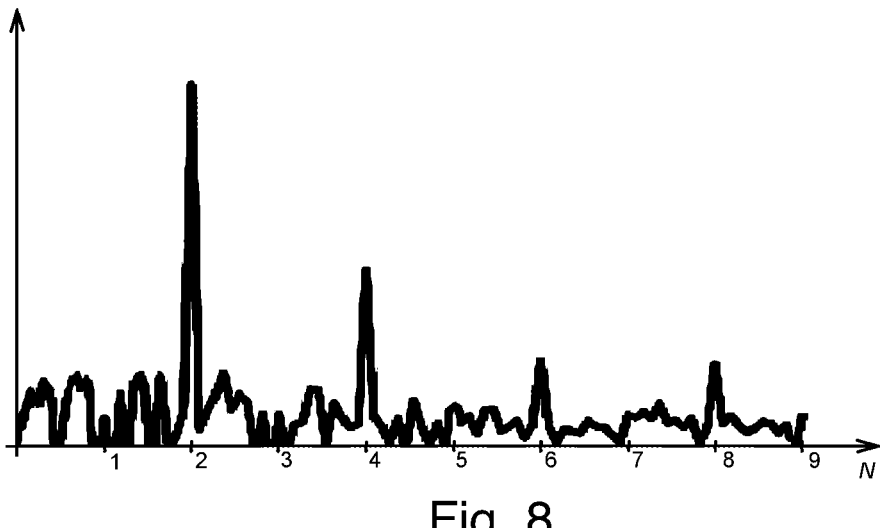
FIG. 8 shows a Fourier spectrum of the difference between magnetic fields, measured with and without DC current.

The Fourier spectrum depicted in FIG. 8 arises if a DC current is applied in the wall of the pipeline, the magnetic field arising on the inner surface of the pipeline wall is likewise measured again, and, subsequently, the difference of the field with the DC current and the field without the DC current is formed in the spectrum. The peaks at N=2, N=4, N=6, and N=8, which arise due to the secondary magnetic field which extends into the pipe interior on account of the local changes in the permeability, are clearly visible. With the exception of the zero frequency, the maximum value has a frequency corresponding to the frequency of the directional change of the magnetic field. In the case of the magnet wheel depicted in the figure, the magnetic direction changes four times per revolution. While the spectrum of the primary magnetic field is now determined by integer multiples of f$_m$=2*v/(π*D) (where D is the diameter of the magnet wheel, v is the speed of the center of the magnet wheel), the spectrum of the secondary magnetic field is represented by frequencies which are multiples of 2*f$_m$. The accuracy of the spectrum increases with the length of the signal cut out for the calculation. Preferably, signal lengths of 6 to 12 main periods are used for the evaluation.

The primary and secondary magnetic fields are distributed differently in space. A plurality of magnetic field sensors may be installed at different positions for the purpose of a better separation of the primary and secondary magnetic fields. The recorded signals can be used to construct a combined feature vector.

$$V = \left[ \frac{F_1(2f_m)}{F_1(f_m)}, \frac{F_1(4f_m)}{F_1(f_m)}, \frac{F_1(6f_m)}{F_1(f_m)}, \right.$$
$$\left. \frac{F_2(8f_m)}{F_1(f_m)}, \dots, \frac{F_n(2f_m)}{F_n(f_m)}, \frac{F_n(4f_m)}{F_n(f_m)}, \frac{F_n(6f_m)}{F_n(f_m)}, \frac{F_n(8f_m)}{F_n(f_m)} \right],$$

where F$_n$, is the spectrum corresponding to the signal recorded by the n-th magnetic field sensor. The dimension of the vector V can be reduced, for example with the aid of principal component methods, before the regression function is formed.

Figure 9:
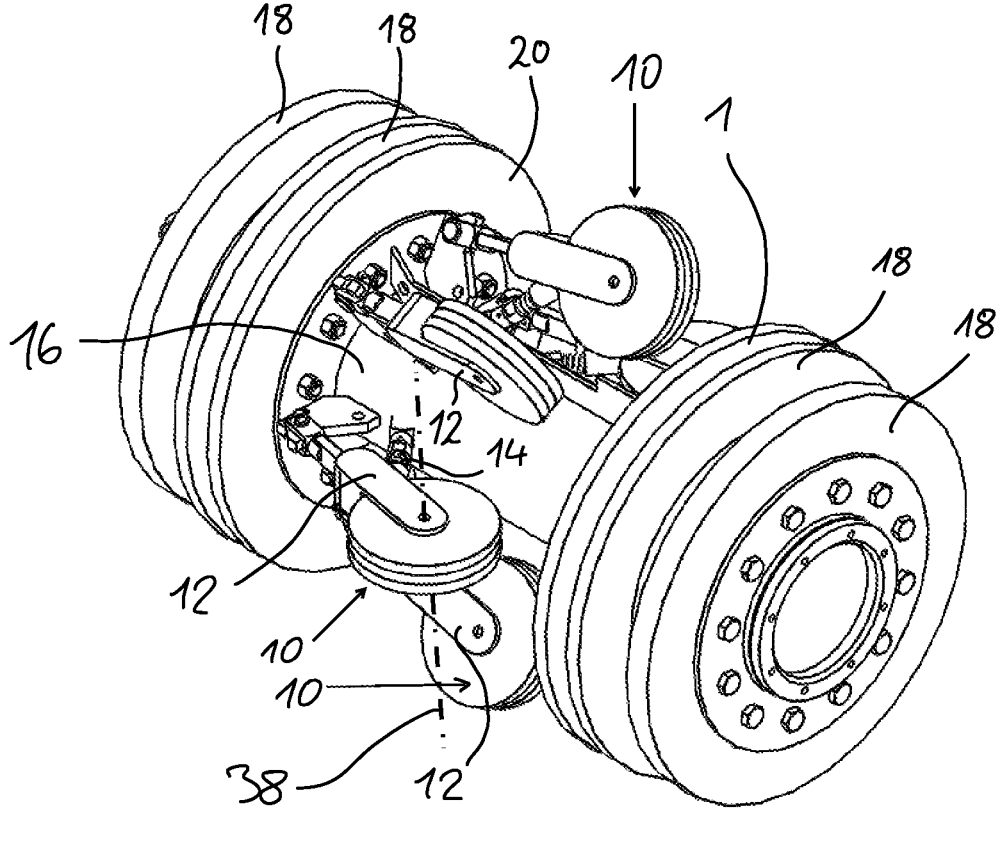
FIG. 9 shows an object according to the invention.

To this end, a plurality of measuring devices with corresponding magnetizing devices 10 and magnetic field sensors may be provided on an inspection device, in particular in accordance with the exemplary embodiment of FIG. 9. An inspection device designed as an inspection pig comprises the magnetizing devices 10, which are held via respective holders 12 on the further inspection device. During operation, a respective holder 12 is pressed against the inner side or surface of the wall 1 by means of a force-storing element 14 in the form of a spring, which is arranged on the holder 12 at one end and mounted on the central body of the inspection device at the other end. The holder 12 itself is pivotably hinged on the central body 16 of the inspection device. On account of the magnetic interaction of the individual magnet units with the wall 1 of the pipeline, the magnetizing devices 10 precisely roll on the said pipeline while the inspection device is propelled by the medium situated in the pipeline. To this end, the inspection device comprises sealing elements in the form of disks 18, which substantially completely cover the internal, free pipeline cross section. The sealing elements additionally center the inspection device and in part lead to a certain amount of cleaning of the pipeline wall 1. To be able to calibrate the results in improved fashion, a current is fed into the wall 1 of the pipeline via metal brushes 20.

Figure 11:
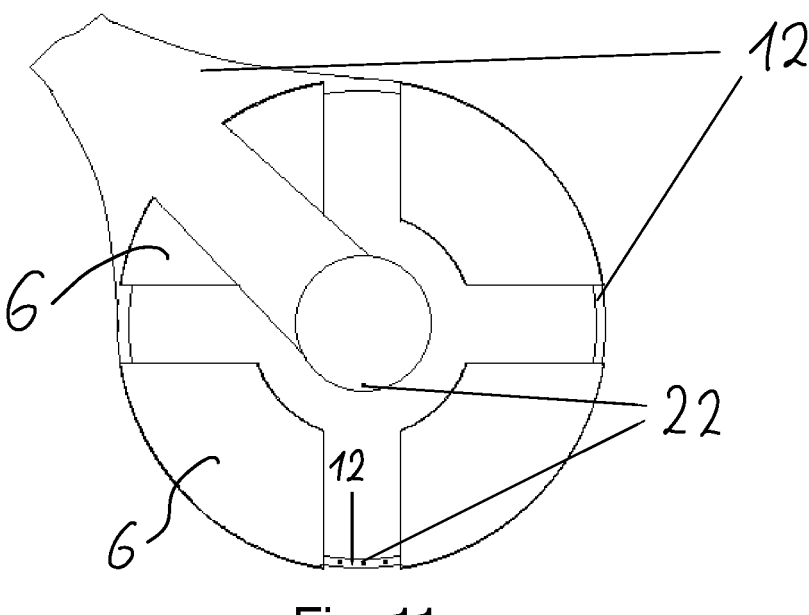
FIG. 11 shows a detailed view of a further object according to the invention.

There are a multiplicity of different options regarding the arrangement of magnetic field sensors. According to the exemplary embodiment of FIG. 9, a multiplicity of magnetic field sensors 22, represented in punctiform fashion, are arranged along the perimeter of the carrier 5. Alternatively, the magnetic field sensors 22 are fixedly arranged on the holder 12, with the result that the magnetic field sensors 22 remain at a fixed distance from the inner upper side of the wall 1 (FIG. 11). Combinations of these arrangements are also possible.

A measuring device, which preferably is a part of the inspection device, generally comprises electronics required for the readout and possibly required sensor control, associated storage means and power supply means.

Figure 12:
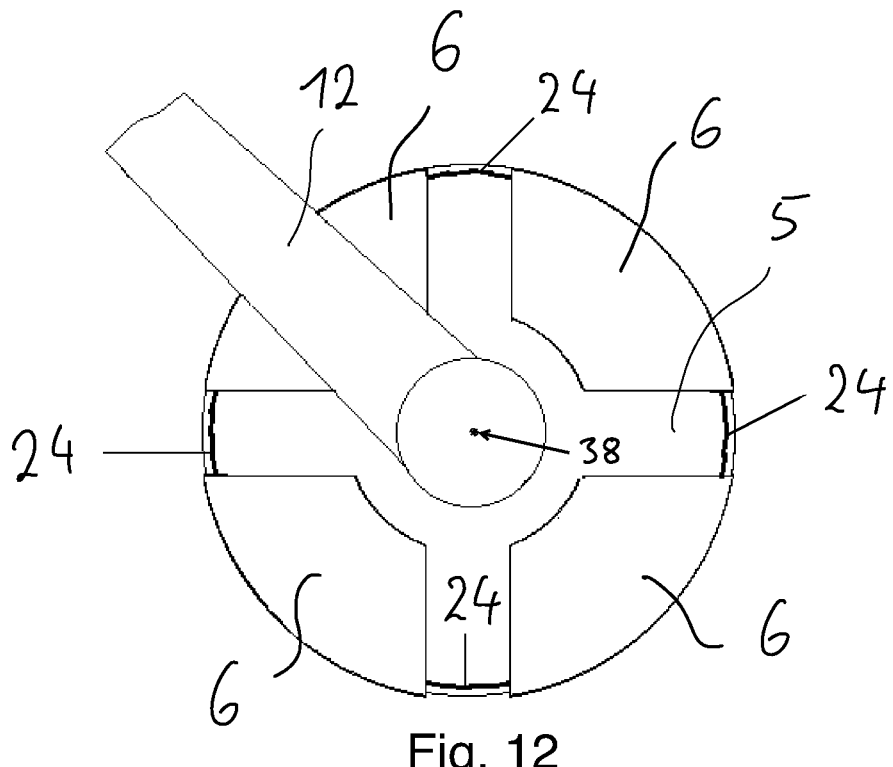
FIG. 12 shows a detailed view of a further object according to the invention.
Figure 13:
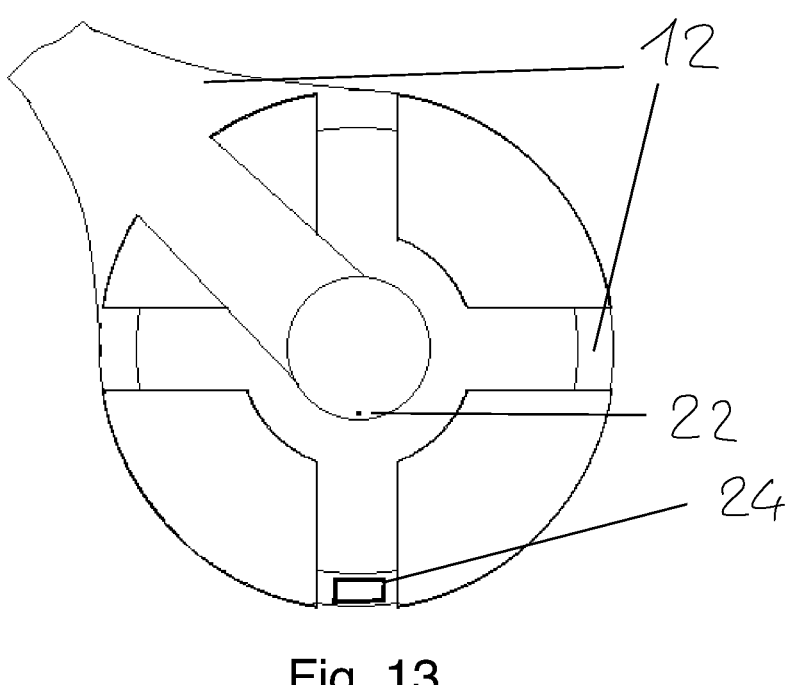
FIG. 13 shows a detailed view of a further object according to the invention.

In yet a further alternative, or cumulatively, a magnetic field sensor may be designed as a coil wound along the entire perimeter of the carrier 5, indicated by windings 24 in FIG. 12.

The scope of the invention likewise includes the combination of a magnetic field sensor 22 fixedly arranged on the holder 12 with a magnetic field sensor comprising windings 24 of a coil.

In the case of a measurement of the magnetic field by means of a coil along the entire perimeter of the carrier 5 in particular, said coil always has the same geometric configuration in relation to the contact point with the inner wall. As a result, it is possible to construct the magnetizing device with the magnetic field sensor comparatively easily.

Figure 14:
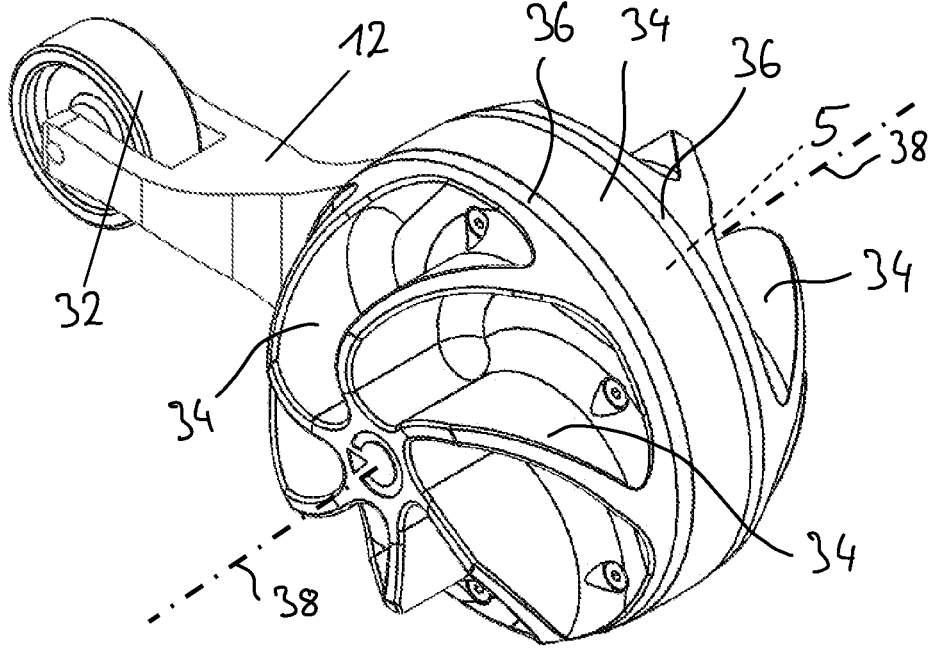
FIG. 14 shows a further object according to the invention.

According to FIG. 14, a further exemplary embodiment according to the invention is provided with a support element 32 in the form of a roller wheel, which is provided to support the inspection device against the pipeline wall and which is rotatably held on the holder 12 that serves as a fastening device. The carrier 5, only indicated using dashed lines, is rotatably held via sliding and/or roller bearings in a part 34 of the holder 12, which is hollow cylindrical in the exemplary embodiment above, and partly covered thereby. The axes of rotation of the roller wheel and of the carrier 5 run in parallel, and both run transversely to the pipeline longitudinal direction and direction of travel. The roller wheel is the leading element of the inspection device, the carrier 5 of which comprises propulsion elements 34 spiraling away from an axis of rotation 38. In a view in the direction of the axis of rotation 38, the carrier 5 is provided with a circular perimeter, which is formed by surrounds 36. The above-described focusing elements may be worked into the surrounds 36. Data storage and power supply means are preferably arranged in the carrier 5.

Figure 10:
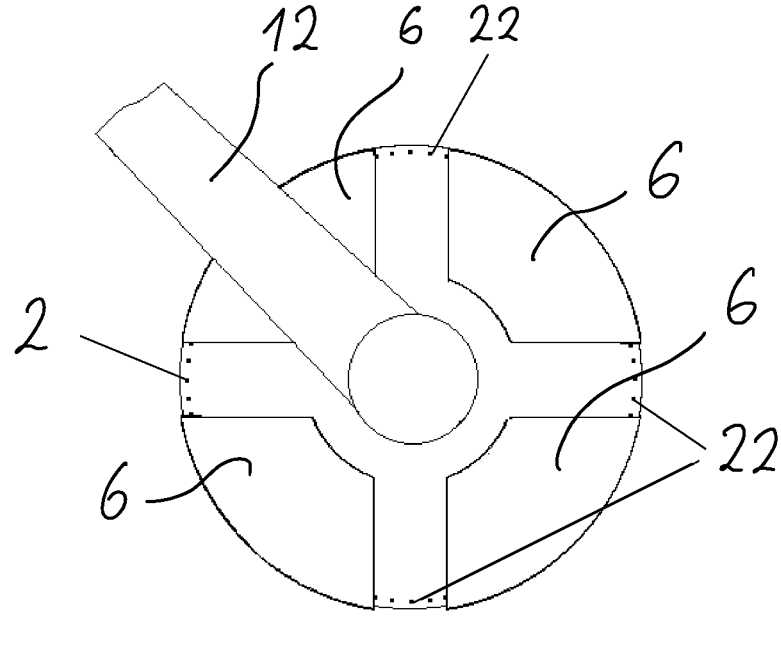
FIG. 10 shows a detailed view of the object according to FIG. 9.
Figure 15:
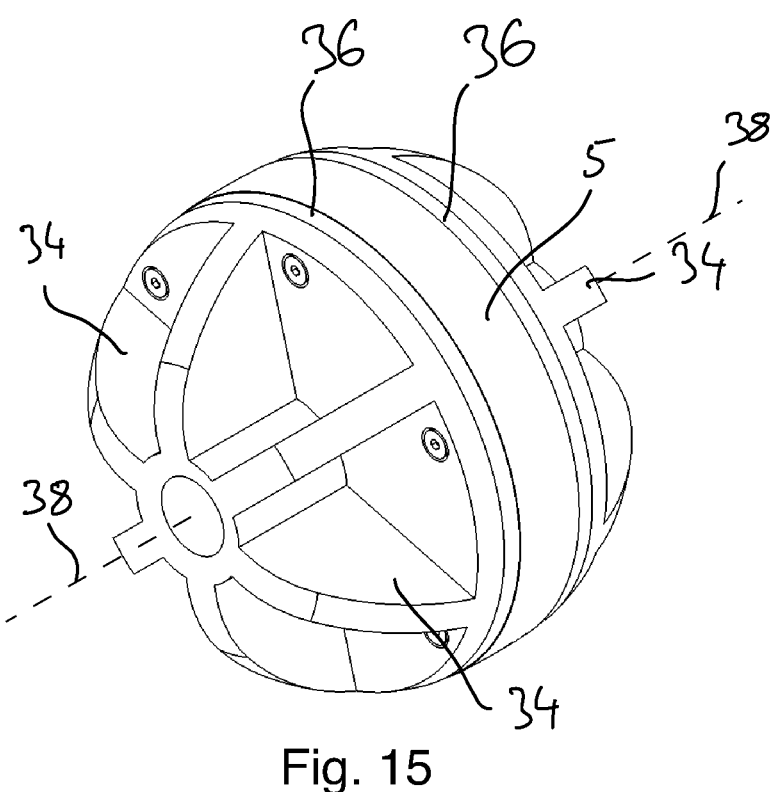
FIG. 15 shows a further object according to the invention.

A further device according to the invention, according to FIG. 15, has a similar design to the variant according to FIG. 14 with laterally protruding propulsion elements 34, but lacks an additional support or roller wheel. Accordingly, the carrier 5 is not mounted in a holder 12 either. The carrier 5 preferably has a setup of magnetic field sensors 12 which corresponds to the arrangement according to the exemplary embodiments in FIG. 10 or 12. In this variant, too, the north-south axes of the permanent magnets arranged in the carrier are arranged parallel to the axis of rotation 38.

The invention claimed is:

1. A method for examining a cathodic protection of a ferromagnetic pipeline, the method comprising:
   creating a primary alternating magnetic field and herewith a local change in permeability in a wall of the ferromagnetic pipeline by a magnetizing device of an inspection device moved through the pipeline, wherein a secondary direct current (DC) magnetic field is caused by a DC current of cathodic protection being formed in the wall of the ferromagnetic pipeline;
   using a measuring device of the inspection device moved through the ferromagnetic pipeline to measure a resultant magnetic field that emerges from superposition of the primary alternating magnetic field and the secondary DC magnetic field;
   using a computing device to analyze signal components of at least the secondary DC magnetic field giving consideration to the local change in the permeability; and
   determining a magnitude of the DC current of the cathodic protection based on the signal components of the secondary DC magnetic field.

2. The method as claimed in claim 1, wherein measurement of the resultant magnetic field takes place while the primary alternating magnetic field is created.

3. The method as claimed in claim 1, further comprising: determining, with the computing device, a spectrum of the secondary DC magnetic field.

4. The method as claimed in claim 3, wherein using the computing device to analyze signal components of at least the secondary DC magnetic field includes:
   selecting, from the signal components, an even multiple of a frequency of a directional change of the primary alternating magnetic field for determining the DC current.

5. The method as claimed in claim 1, further comprising: determining the magnitude of the DC current of the cathodic protection using one or more regression functions in the computing device based on an amplitude of at least one even multiple of a frequency of a directional change of the primary alternating magnetic field.

6. The method as claimed in claim 5, wherein the magnitude of DC current is determined additionally with analysis data of the secondary DC magnetic field being normalized and/or calibrated by analysis data of the primary alternating magnetic field.

7. The method as claimed in claim 1, further comprising: determining, with the computing device, measurement conditions associated with measurement of the resultant magnetic field based on a spectrum of the primary alternating magnetic field.

8. The method as claimed in claim 1, further comprising: varying and at least increasing a voltage of the cathodic protection for a measurement run of the inspection device through the ferromagnetic pipeline.

9. The method as claimed in claim 1, further comprising: determining the magnitude of the DC current of the cathodic protection by fusing a multiplicity of data from a measurement run of the inspection device through the ferromagnetic pipeline.

10. The method as claimed in claim 1, wherein measurement of the resultant magnetic field is implemented by at least one magnetic field sensor which is positioned at least substantially at a fixed distance from the wall at a time of the measurement.

11. The method as claimed in claim 10, wherein the magnetizing device revolves on a carrier in a longitudinal direction of the ferromagnetic pipeline.

12. The method as claimed in claim 10, wherein a distance of at least two magnet units of the magnetizing device from an inner side of the wall varies.

13. The method as claimed in claim 1, further comprising: applying, during a measurement run of the inspection device through the ferromagnetic pipeline, an additional current to an inner wall side of the ferromagnetic pipeline by two contacts spaced apart in a longitudinal direction of the ferromagnetic pipeline.

14. The method as claimed in claim 1, wherein the magnitude of the DC current is derived based on a database with calibration data.

15. An inspection device for examining a cathodic protection of a pipeline, the inspection device being formed to be able to pass through a pipeline, the inspection device comprising:

a magnetizing device configured to create an alternating magnetic field, the magnetizing device having:

a measuring device including at least one magnetic field sensor configured to measure a magnetic field formed on an inner side of a wall of the pipeline, at least one carrier configured to be rolled through the pipeline in a longitudinal direction thereof in an operational state, the at least one carrier having an at least substantially circular perimeter in a section running transversely to an axis of rotation, and, at least two magnet units positioned along the perimeter of the at least one carrier, the at least two magnet units configured to create an alternating magnetic field, magnetic field directions of which run opposite one another, wherein the at least two magnetic units are configured such that the magnetic field formed on the inner side of a wall of the pipeline is caused by a DC current of cathodic protection being formed in the wall of the ferromagnetic pipeline.

16. The inspection device as claimed in claim 15, wherein the magnetic field directions of the at least two magnet units are formed parallel or radially to the axis of rotation of the at least one carrier.

17. The inspection device as claimed in claim 15, wherein, along the perimeter of the at least one carrier, at least one magnetic field sensor is arranged on or in the at least one carrier.

18. The inspection device as claimed in claim 17, wherein the at least one magnetic field sensor is a coil with windings running in a circumferential direction.

19. The inspection device as claimed in claim 17, further including a multiplicity of magnetic field sensors arranged next to one another along the perimeter.

20. The inspection device as claimed in claim 15, wherein a part of the measuring device is arranged in a holder for arrangement close to the wall.

21. The inspection device as claimed in claim 20, wherein the at least one carrier is rotatably mounted on the holder.

22. The inspection device as claimed in claim 20, wherein the at least one carrier is provided via the holder with a supporting element being a roller wheel, a diameter of which is no more than 50% of the diameter of the at least one carrier.

23. The inspection device as claimed in claim 15, wherein the magnetizing device and the at least one magnetic field sensor are movable relative to one another.

24. The inspection device as claimed in claim 15, further including at least one disk protruding laterally from an axis of rotation or at least one cup spiraling away from the axis of rotation to propel the inspection device through the ferromagnetic pipeline.

25. The inspection device as claimed in claim 15, further including at least one propulsion element to propel the inspection device through the ferromagnetic pipeline.

* * * * *